(12) United States Patent
Hu

(10) Patent No.: US 11,640,778 B2
(45) Date of Patent: May 2, 2023

(54) GOA CIRCUIT

(71) Applicant: Shenzhen China Star Optoelectronics Semiconductor Display Technology Co., Ltd., Guangdong (CN)

(72) Inventor: Xiaobin Hu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 367 days.

(21) Appl. No.: 17/056,032

(22) PCT Filed: Oct. 27, 2020

(86) PCT No.: PCT/CN2020/123901
§ 371 (c)(1),
(2) Date: Nov. 17, 2020

(87) PCT Pub. No.: WO2022/047951
PCT Pub. Date: Mar. 10, 2022

(65) Prior Publication Data
US 2022/0309976 A1 Sep. 29, 2022

(30) Foreign Application Priority Data
Sep. 4, 2020 (CN) .......................... 202010920028.2

(51) Int. Cl.
*G09G 3/20* (2006.01)
(52) U.S. Cl.
CPC ....... *G09G 3/20* (2013.01); *G09G 2310/0267* (2013.01); *G09G 2310/0286* (2013.01)

(58) Field of Classification Search
CPC ... G09G 3/3266; G09G 3/3674; G09G 3/3677
See application file for complete search history.

(56) References Cited

U.S. PATENT DOCUMENTS

| | | | |
|---|---|---|---|
| 10,283,068 B1* | 5/2019 | Lv | G09G 3/3677 |
| 2010/0156474 A1 | 6/2010 | Park et al. | |
| 2012/0139883 A1 | 6/2012 | Lee et al. | |
| 2017/0076684 A1* | 3/2017 | Kim | G09G 3/3677 |
| 2018/0033391 A1* | 2/2018 | So | H01L 51/50 |
| 2019/0073977 A1* | 3/2019 | Zeng | G09G 3/3674 |

FOREIGN PATENT DOCUMENTS

| | | |
|---|---|---|
| CN | 105047155 | 11/2015 |
| CN | 106448592 | 2/2017 |
| CN | 108962171 | 12/2018 |
| CN | 109493783 | 3/2019 |
| CN | 110097861 | 8/2019 |

* cited by examiner

*Primary Examiner* — Christopher J Kohlman

(57) ABSTRACT

A gate driver on array (GOA) circuit includes a plurality of GOA units, wherein the GOA units are cascaded. The cascaded GOA units includes an Nth-stage GOA unit including a pull-up control module, a cascade module, a pull-down holding module, a pull-down control module, and a signal output module. A structure of an inverter module in the pull-down holding module is improved. Advantageous effects are as follows. The inverter module in the pull-down holding module is optimized. Difference in a voltage-ampere characteristic between each of transistors after long-term operation of the inverter module is effectively reduced, thereby increasing operating time of the inverter module.

20 Claims, 3 Drawing Sheets

US 11,640,778 B2

GOA CIRCUIT

RELATED APPLICATIONS

This application is a National Phase of PCT Patent Application No. PCT/CN2020/123901 having International filing date of Oct. 27, 2020, which claims the benefit of priority of Chinese Patent Application No. 202010920028.2 filed on Sep. 4, 2020. The contents of the above applications are all incorporated by reference as if fully set forth herein in their entirety.

FIELD AND BACKGROUND OF THE INVENTION

The present disclosure relates to a technical field of displays, and more particularly to a gate driver on array (GOA) circuit.

Gate driver on array (GOA) technologies, gate row scan driving technologies, are conducive to realizations of designs of narrow borders on gate driver sides of display screens and cost reductions.

Referring to FIGS. 1 and 2, in an existing GOA circuit, an inverter module generally includes four transistors: a transistor $T_{51}$, a transistor $T_{52}$, a transistor $T_{53}$, and a transistor $T_{54}$. Bias stress conditions of three-terminal voltages of these four transistors are different. (A gate and a drain of the transistor $T_{51}$ are simultaneously electrically coupled to an Nth-stage clock signal. An electric potential of the source of the transistor $T_{51}$ is slightly lower than an electric potential of the gate and a drain of the transistor $T_{51}$ by a threshold voltage. The transistor $T_{51}$ is under a weak positive bias stress condition. An electric potential of a gate of the transistor $T_{53}$ is same as the electric potential of the source of the transistor $T_{51}$. An electric potential of a drain of the transistor $T_{53}$ is equal to an electric potential of the Nth-stage clock signal. An electric potential of a source of the transistor $T_{53}$ is further lower than the electric potential of the gate of the transistor $T_{53}$ by a threshold voltage. The transistor $T_{53}$ is under a weak negative bias stress condition. Gates and sources of the transistor $T_{52}$ and the transistor $T_{54}$ are at a low electric potential for a long time. Following the Nth-stage clock signal, drains of the transistor $T_{52}$ and the transistor $T_{54}$ are alternately at the low electric potential and high electric potentials. The transistor $T_{52}$ and the transistor $T_{54}$ are under strong negative bias stress conditions.) After long-term operation, difference in voltage-ampere characteristics between the different transistors become larger because of the different bias stress conditions, which causes the inverter module to fail to operate normally.

Thus, in the existing display panel technology, there is a problem that because of the different bias stress conditions of the transistors in the inverter module of the GOA circuit, the difference in the voltage-ampere characteristics between the transistors become larger, which affects operating performance of the inverter module under long-term operation. It is urgently desired to solve the problem.

SUMMARY OF THE INVENTION

Technical problems are as follows. The present disclosure relates to a gate driver on array (GOA) circuit configured to solve a problem in the related art that because of different bias stress conditions of transistors in an inverter module of the GOA circuit, difference in voltage-ampere characteristics between the transistors become larger, which affects operating performance of the inverter module under long-term operation.

Technical solutions are as follows. In order to solve the aforementioned problem, the present disclosure provides the following technical solutions.

The present disclosure provides a gate driver on array (GOA) circuit including a plurality of GOA units, wherein the GOA units are cascaded; and wherein the cascaded GOA units include an Nth-stage GOA unit comprising:

a pull-up control module configured to control, in response to an (N−1)th-stage stage transfer signal, that a constant high voltage level signal is received by a first driving signal output by the pull-up control module; a cascade module configured to control, in response to the first driving signal output by the pull-up control module, that an Nth-stage first clock signal is output as an Nth-stage stage transfer signal; a pull-down holding module configured to control, in response to the Nth-stage first clock signal, an Nth-stage second clock signal, and the first driving signal output by the pull-up control module, that the pull-down holding module electrically couples an Nth-stage gate driving signal to a second constant low voltage level signal, electrically couples the Nth-stage stage transfer signal to a first constant low voltage level signal, and electrically couples the first driving signal to the first constant low voltage level signal; the pull-down control module configured to, in response to an (N+1)th-stage stage transfer signal, pull down the first driving signal output by the pull-up control module to the first constant low voltage level signal and pull down the Nth-stage gate driving signal to the second constant low voltage level signal; and the signal output module configured to control, in response to the first driving signal output by the pull-up control module, that the Nth-stage first clock signal is output as the Nth-stage gate driving signal; wherein the Nth-stage first clock signal and the Nth-stage second clock signal are completely opposite high-frequency alternating current (AC) signals.

In some embodiments of the present disclosure, the pull-down holding module includes: an inverter module and a node voltage pull-down holding module; wherein the inverter module includes: a first transistor ($T_{51}$), a second transistor ($T_{54}$), and a third transistor ($T_{55}$); wherein a control terminal of the first transistor ($T_{51}$) is electrically coupled to the Nth-stage first clock signal, a first terminal of the first transistor ($T_{51}$) is electrically coupled to the constant high voltage level signal, and a second terminal of the first transistor ($T_{51}$) is electrically coupled to a K(N) node; wherein a control terminal of the second transistor ($T_{54}$) is electrically coupled to a node where the first driving signal is located, a first terminal of the second transistor ($T_{54}$) is electrically coupled to the K(N) node, and a second terminal of the second transistor ($T_{54}$) is electrically coupled to the first constant low voltage level signal; wherein a control terminal of the third transistor ($T_{55}$) is electrically coupled to the Nth-stage second clock signal, a first terminal of the third transistor ($T_{55}$) is electrically coupled to the K(N) node, and a second terminal of the third transistor ($T_{55}$) is electrically coupled to the first constant low voltage level signal; wherein the node voltage pull-down holding module includes: a fourth transistor ($T_{32}$), a fifth transistor ($T_{72}$), and a sixth transistor ($T_{42}$); wherein control terminals of the fourth transistor ($T_{32}$), the fifth transistor ($T_{72}$), and the sixth transistor ($T_{42}$) are all electrically coupled to the K(N) node, a first terminal of the fourth transistor ($T_{32}$) is electrically coupled to the Nth-stage gate driving signal, a second terminal of the fourth transistor ($T_{32}$) is electrically coupled to the second constant low voltage level signal, a first terminal of the fifth transistor ($T_{72}$) is electrically coupled to the Nth-stage stage transfer signal, a first terminal of the sixth transistor ($T_{42}$) is electrically coupled to the node where the first driving signal is located, second terminals of the fifth transistor ($T_{72}$) and the sixth transistor ($T_{42}$) are both electrically coupled to the first constant low voltage level signal.

In some embodiments of the present disclosure, the pull-up control module is provided with a seventh transistor ($T_{11}$) and a bootstrap capacitor ($C_b$); wherein a control terminal of the seventh transistor ($T_{11}$) is electrically coupled to the (N−1)th-stage stage transfer signal, a first terminal of the seventh transistor ($T_{11}$) is electrically coupled to the constant high voltage level signal, and a second terminal of the seventh transistor ($T_{11}$) is electrically coupled to a node where the first driving signal is located; wherein a first terminal of the bootstrap capacitor ($C_b$) is electrically coupled to the node where the first driving signal is located, and a second terminal of the bootstrap capacitor ($C_b$) is electrically coupled to the Nth-stage gate driving signal.

In some embodiments of the present disclosure, the cascade module includes an eighth transistor ($T_{22}$); wherein a control terminal of the eighth transistor ($T_{22}$) is electrically coupled to a node where the first driving signal is located, a first terminal of the eighth transistor ($T_{22}$) is electrically coupled to the Nth-stage first clock signal, and a second terminal of the eighth transistor ($T_{22}$) is electrically coupled to the Nth-stage stage transfer signal.

In some embodiments of the present disclosure, the pull-down control module includes: a ninth transistor ($T_{31}$) and a tenth transistor ($T_{41}$); wherein control terminals of the ninth transistor ($T_{31}$) and the tenth transistor ($T_{41}$) are both electrically coupled to the (N+1)th-stage stage transfer signal, a first terminal of the ninth transistor ($T_{31}$) is electrically coupled to the Nth-stage gate driving signal, a second terminal of the ninth transistor ($T_{31}$) is electrically coupled to the second constant low voltage level signal, a first terminal of the tenth transistor ($T_{41}$) is electrically coupled to a node where the first driving signal is located, and a second terminal of the tenth transistor ($T_{41}$) is electrically coupled to the first constant low voltage level signal.

In some embodiments of the present disclosure, the signal output module is provided with an eleventh transistor ($T_{21}$); wherein a control terminal of the eleventh transistor ($T_{21}$) is electrically coupled to a node where the first driving signal is located, a first terminal of the eleventh transistor ($T_{21}$) is electrically coupled to the Nth-stage first clock signal, and a second terminal of the eleventh transistor ($T_{21}$) is electrically coupled to the Nth-stage gate driving signal.

In some embodiments of the present disclosure, the GOA circuit further includes a reset module configured to control, in response to a reset signal, that the first driving signal is reset to the first constant low voltage level signal, the Nth-stage stage transfer signal is reset to the first constant low voltage level signal, and the Nth-stage gate driving signal is reset to the second constant low voltage level signal.

In some embodiments of the present disclosure, the reset module includes: a twelfth transistor ($T_{rQ}$), a thirteenth transistor ($T_{rS}$), and a fourteenth transistor ($T_{rG}$); wherein control terminals of the twelfth transistor ($T_{rQ}$), the thirteenth transistor ($T_{rS}$), and the fourteenth transistor ($T_{rG}$) are all electrically coupled to a node where the reset signal is located, a first terminal of the twelfth transistor ($T_{rQ}$) is electrically coupled to a node where the first driving signal is located, a second terminal of the twelfth transistor ($T_{rQ}$) is electrically coupled to the first constant low voltage level signal, a first terminal of the thirteenth transistor ($T_{rS}$) is electrically coupled to the Nth-stage stage transfer signal, a second terminal of the thirteenth transistor ($T_{rS}$) is electrically coupled to the first constant low voltage level signal, a first terminal of the fourteenth transistor ($T_{rG}$) is electrically coupled to the Nth-stage gate driving signal, and a second terminal of the fourteenth transistor ($T_{rG}$) is electrically coupled to the second constant low voltage level signal.

In some embodiments of the present disclosure, the pull-down holding module includes: a first pull-down holding module and a second pull-down holding module; wherein the first pull-down holding module is provided with a first inverter module and a first node voltage pull-down holding module, and the second pull-down holding module is provided with a second inverter module and a second node voltage pull-down holding module.

In some embodiments of the present disclosure, the first inverter module includes: a fifteenth transistor ($T_{51'}$), a sixteenth transistor ($T_{54'}$), and a seventeenth transistor ($T_{55'}$); wherein a control terminal of the fifteenth transistor ($T_{51'}$) is electrically coupled to the Nth-stage first clock signal, a first terminal of the fifteenth transistor ($T_{51'}$) is electrically coupled to the constant high voltage level signal, and a second terminal of the fifteenth transistor ($T_{51'}$) is electrically coupled a K(N) node; wherein a control terminal of the sixteenth transistor ($T_{54'}$) is electrically coupled to a node where the first driving signal is located, a first terminal of the sixteenth transistor ($T_{54'}$) is electrically coupled to the K(N) node, and a second terminal of the sixteenth transistor ($T_{54'}$) is electrically coupled to the first constant low voltage level signal; wherein a control terminal of the seventeenth transistor ($T_{55'}$) is electrically coupled to the Nth-stage second clock signal, a first terminal of the seventeenth transistor ($T_{55'}$) is electrically coupled to the K(N) node, and a second terminal of the seventeenth transistor ($T_{55'}$) is electrically coupled to the first constant low voltage level signal; wherein the first node voltage pull-down holding module includes: an eighteenth transistor ($T_{32'}$), a nineteenth transistor ($T_{72'}$), and a twentieth transistor ($T_{42'}$); wherein control terminals of the eighteenth transistor ($T_{32'}$), the nineteenth transistor ($T_{72'}$), and the twentieth transistor ($T_{42'}$) are all electrically coupled to the K(N) node, a first terminal of the eighteenth transistor ($T_{32'}$) is electrically coupled to Nth-stage gate driving signal, a second terminal of the eighteenth transistor ($T_{32'}$) is electrically coupled to the second constant low voltage level signal, a first terminal of the nineteenth transistor ($T_{72'}$) is electrically coupled to the Nth-stage stage transfer signal, a second terminal of the nineteenth transistor ($T_{72'}$) is electrically coupled to the first constant low voltage level signal, a first terminal of the twentieth transistor ($T_{42'}$) is electrically coupled to the node where the first driving signal is located, and a second terminal of the twentieth transistor ($T_{42'}$) is electrically coupled to the first constant low voltage level signal; wherein the second inverter module includes: a twenty-first transistor ($T_{61}$), a twenty-second transistor ($T_{64}$), and a twenty-third transistor ($T_{65}$); wherein a control terminal of the twenty-first transistor ($T_{61}$) is electrically coupled to the Nth-stage second clock signal, a first terminal of the twenty-first transistor ($T_{61}$) is electrically coupled to the constant high voltage level signal, and a second terminal of the twenty-first transistor ($T_{61}$) is electrically coupled to a P(N) node; wherein a control terminal of the twenty-second transistor ($T_{64}$) is electrically coupled to the node where the first driving signal is located, a first terminal of the twenty-second transistor ($T_{64}$) is electrically coupled to the P(N) node, and a second terminal of the twenty-second transistor ($T_{64}$) is electrically coupled to the first constant low voltage level signal; wherein a control terminal of the twenty-third transistor ($T_{65}$) is electrically coupled to the Nth-stage first clock signal, a first terminal of the twenty-third transistor ($T_{65}$) is electrically coupled to the P(N) node, and a second terminal of twenty-third transistor ($T_{65}$) is electrically coupled to the first constant low voltage level signal; and wherein the second node voltage pull-down holding module includes: a twenty-fourth transistor ($T_{33}$), a twenty-fifth transistor ($T_{73}$) and a twenty-sixth transistor ($T_{43}$); wherein control terminals of the twenty-fourth transistor ($T_{33}$), the twenty-fifth transistor ($T_{73}$), and the twenty-sixth transistor ($T_{43}$) are all electrically coupled to the P(N) node, a first terminal of the twenty-fourth transistor ($T_{33}$) is electrically coupled to the Nth-stage gate driving signal, a second terminal of the twenty-fourth transistor ($T_{33}$) is electrically coupled to the second constant low voltage level signal, a first terminal of the twenty-fifth transistor ($T_{73}$) is electrically coupled to the Nth-stage stage transfer signal, a second terminal of the twenty-fifth transistor ($T_{73}$) is electrically coupled to the first constant low voltage level signal, a first terminal of the twenty-sixth transistor ($T_{43}$) is electrically coupled to the node where the first driving signal is located, a second terminal of the twenty-sixth transistor ($T_{43}$) is electrically coupled to the first constant low voltage level signal.

In some embodiments of the present disclosure, the transistors are N-type transistors or the transistors are a combination of N-type transistors and P-type transistors.

The present disclosure also provides a GOA circuit including a plurality of GOA units, wherein the GOA units are cascaded; and wherein the cascaded GOA units include an Nth-stage GOA unit comprising: a pull-up control module configured to control, in response to an (N−1)th-stage stage transfer signal, that a constant high voltage level signal is received by a first driving signal output by the pull-up control module; a cascade module configured to control, in response to the first driving signal output by the pull-up control module, that an Nth-stage first clock signal is output as an Nth-stage stage transfer signal; a pull-down holding module configured to control, in response to the Nth-stage first clock signal, an Nth-stage second clock signal, and the first driving signal output by the pull-up control module, that the pull-down holding module electrically couples an Nth-stage gate driving signal to a second constant low voltage level signal, electrically couples the Nth-stage stage transfer signal to a first constant low voltage level signal, and electrically couples the first driving signal to the first constant low voltage level signal; the pull-down control module configured to, in response to an (N+1)th-stage stage transfer signal, pull down the first driving signal output by the pull-up control module to the first constant low voltage level signal and pull down the Nth-stage gate driving signal to the second constant low voltage level signal; and the signal output module configured to control, in response to the first driving signal output by the pull-up control module, that the Nth-stage first clock signal is output as the Nth-stage gate driving signal.

In some embodiments of the present disclosure, the pull-down holding module includes: an inverter module and a node voltage pull-down holding module; wherein the inverter module includes: a first transistor ($T_{51}$), a second transistor ($T_{54}$), and a third transistor ($T_{55}$); wherein a control terminal of the first transistor ($T_{51}$) is electrically coupled to the Nth-stage first clock signal, a first terminal of the first transistor ($T_{51}$) is electrically coupled to the constant high voltage level signal, and a second terminal of the first transistor ($T_{51}$) is electrically coupled to a K(N) node; wherein a control terminal of the second transistor ($T_{54}$) is electrically coupled to a node where the first driving signal is located, a first terminal of the second transistor ($T_{54}$) is electrically coupled to the K(N) node, and a second terminal of the second transistor ($T_{54}$) is electrically coupled to the first constant low voltage level signal; wherein a control terminal of the third transistor ($T_{55}$) is electrically coupled to the Nth-stage second clock signal, a first terminal of the third transistor ($T_{55}$) is electrically coupled to the K(N) node, and a second terminal of the third transistor ($T_{55}$) is electrically coupled to the first constant low voltage level signal; wherein the node voltage pull-down holding module includes: a fourth transistor ($T_{32}$), a fifth transistor ($T_{72}$), and a sixth transistor ($T_{42}$); wherein control terminals of the fourth transistor ($T_{32}$), the fifth transistor ($T_{72}$), and the sixth transistor ($T_{42}$) are all electrically coupled to the K(N) node, a first terminal of the fourth transistor ($T_{32}$) is electrically coupled to the Nth-stage gate driving signal, a second terminal of the fourth transistor ($T_{32}$) is electrically coupled to the second constant low voltage level signal, a first terminal of the fifth transistor ($T_{72}$) is electrically coupled to the Nth-stage stage transfer signal, a first terminal of the sixth transistor ($T_{42}$) is electrically coupled to the node where the first driving signal is located, second terminals of the fifth transistor ($T_{72}$) and the sixth transistor ($T_{42}$) are both electrically coupled to the first constant low voltage level signal.

In some embodiments of the present disclosure, the pull-up control module is provided with a seventh transistor ($T_{11}$) and a bootstrap capacitor ($C_b$); wherein a control terminal of the seventh transistor ($T_{11}$) is electrically coupled to the (N−1)th-stage stage transfer signal, a first terminal of the seventh transistor ($T_{11}$) is electrically coupled to the constant high voltage level signal, and a second terminal of the seventh transistor ($T_{11}$) is electrically coupled to a node where the first driving signal is located; wherein a first terminal of the bootstrap capacitor ($C_b$) is electrically coupled to the node where the first driving signal is located, and a second terminal of the bootstrap capacitor ($C_b$) is electrically coupled to the Nth-stage gate driving signal.

In some embodiments of the present disclosure, the cascade module includes an eighth transistor ($T_{22}$); wherein a control terminal of the eighth transistor ($T_{22}$) is electrically coupled to a node where the first driving signal is located, a first terminal of the eighth transistor ($T_{22}$) is electrically coupled to the Nth-stage first clock signal, and a second terminal of the eighth transistor ($T_{22}$) is electrically coupled to the Nth-stage stage transfer signal.

In some embodiments of the present disclosure, the pull-down control module includes: a ninth transistor ($T_{31}$) and a tenth transistor ($T_{41}$); wherein control terminals of the ninth transistor ($T_{31}$) and the tenth transistor ($T_{41}$) are both electrically coupled to the (N+1)th-stage stage transfer signal, a first terminal of the ninth transistor ($T_{31}$) is electrically coupled to the Nth-stage gate driving signal, a second terminal of the ninth transistor ($T_{31}$) is electrically coupled to the second constant low voltage level signal, a first terminal of the tenth transistor ($T_{41}$) is electrically coupled to a node where the first driving signal is located, and a second terminal of the tenth transistor ($T_{41}$) is electrically coupled to the first constant low voltage level signal.

In some embodiments of the present disclosure, the signal output module is provided with an eleventh transistor ($T_{21}$); wherein a control terminal of the eleventh transistor ($T_{21}$) is electrically coupled to a node where the first driving signal is located, a first terminal of the eleventh transistor ($T_{21}$) is electrically coupled to the Nth-stage first clock signal, and a second terminal of the eleventh transistor ($T_{21}$) is electrically coupled to the Nth-stage gate driving signal.

In some embodiments of the present disclosure, the GOA circuit further includes a reset module configured to control, in response to a reset signal, that the first driving signal is reset to the first constant low voltage level signal, the Nth-stage stage transfer signal is reset to the first constant low voltage level signal, and the Nth-stage gate driving signal is reset to the second constant low voltage level signal.

In some embodiments of the present disclosure, the reset module includes: a twelfth transistor ($T_{rQ}$), a thirteenth transistor ($T_{rS}$), and a fourteenth transistor ($T_{rG}$); wherein control terminals of the twelfth transistor ($T_{rQ}$), the thirteenth transistor ($T_{rS}$), and the fourteenth transistor ($T_{rG}$) are all electrically coupled to a node where the reset signal is located, a first terminal of the twelfth transistor ($T_{rQ}$) is electrically coupled to a node where the first driving signal is located, a second terminal of the twelfth transistor ($T_{rQ}$) is electrically coupled to the first constant low voltage level signal, a first terminal of the thirteenth transistor ($T_{rS}$) is electrically coupled to the Nth-stage stage transfer signal, a second terminal of the thirteenth transistor ($T_{rS}$) is electrically coupled to the first constant low voltage level signal, a first terminal of the fourteenth transistor ($T_{rG}$) is electrically coupled to the Nth-stage gate driving signal, and a second terminal of the fourteenth transistor ($T_{rG}$) is electrically coupled to the second constant low voltage level signal.

In some embodiments of the present disclosure, the pull-down holding module includes: a first pull-down holding module and a second pull-down holding module; wherein the first pull-down holding module is provided with a first inverter module and a first node voltage pull-down holding module, and the second pull-down holding module is provided with a second inverter module and a second node voltage pull-down holding module.

Advantageous effects are as follows. Compared with the related art, the GOA circuit provided by the present disclosure has the following advantageous effects. In the GOA circuit provided by the present disclosure, the inverter module in the pull-down holding module is optimized under the basis of maintenance of functions of a traditional technical solution. Thus, difference in a voltage-ampere characteristic between each of the transistors after long-term operation of the inverter module is effectively reduced, thereby increasing operating time of the inverter module.

DETAILED DESCRIPTION OF SPECIFIC EMBODIMENTS OF THE INVENTION

Technical solutions in the embodiments of the present disclosure will be described clearly and completely hereinafter with reference to the accompanying drawings in the embodiments of the present disclosure. Apparently, the described embodiments are merely some rather than all embodiments of the present disclosure. All other embodiments obtained by those of ordinary skill in the art on the basis of the embodiments of the present disclosure without creative efforts shall fall within the protection scope of the present disclosure.

In the description of the present disclosure, it is to be appreciated that orientation or location relationships indicated by terms such as "center", "longitudinal", "transverse", "length", "width", "thickness", "upper", "lower", "front", "back", "left", "right", "vertical", "horizontal", "top", "bottom", "inside", "outside", "clockwise", "counter-clockwise", etc. are based on orientation or location relationships illustrated in the accompanying drawings. The terms are only used to facilitate the description of the present disclosure and to simplify the description, not used to indicate or imply the relevant device or element must have a particular orientation or must be structured and operate under the particular orientation and thus cannot be considered as limitations to the present disclosure. In addition, the terms "first" and "second" are only used for description purpose, and cannot be considered as indicating or implying relative importance or implicitly pointing out the number of relevant technical features. Thus, features being respectively defined as "first" and "second" can each expressly or implicitly include at least one of the features. In the description of the present disclosure, the meaning of "a plurality of" is at least two, such as two and three, unless otherwise definitely and specifically defined.

Specifically referring to FIGS. 3 to 6, the present disclosure provides a gate driver on array (GOA) circuit.

In an inverter module of an existing GOA circuit, because of different bias stress conditions of transistors, difference in voltage-ampere characteristics between the transistors become larger, which affects operating performance of the inverter module under long-term operation. Thus, the present disclosure provides the GOA circuit to solve the aforementioned problem.

Figure 1:
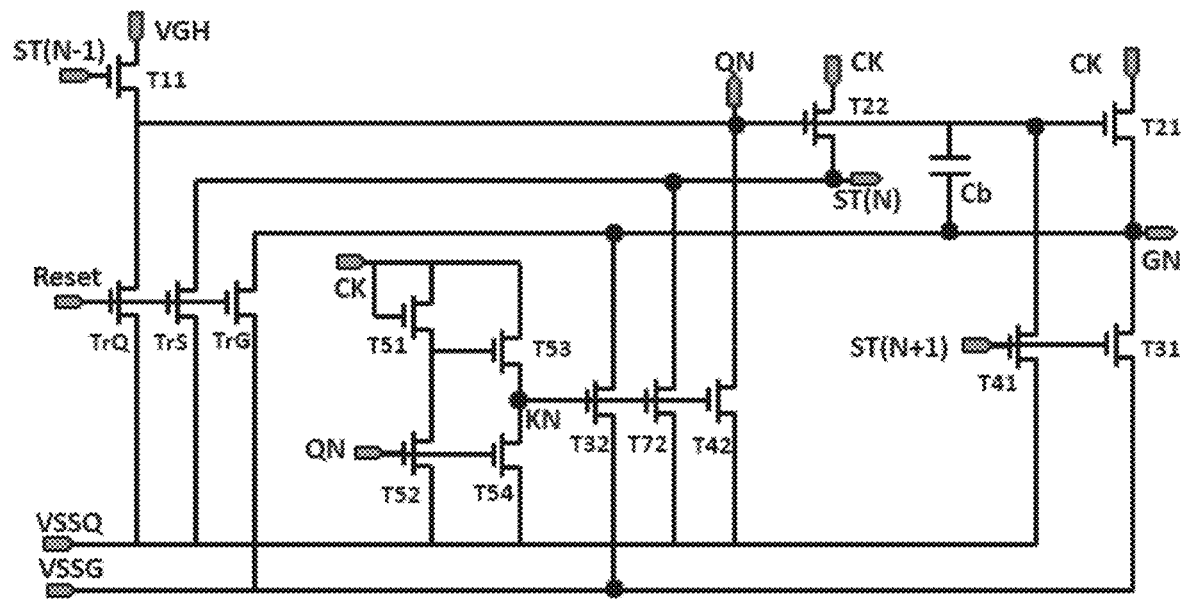
FIG. 1 is a schematic diagram of a structure of a gate driver on array (GOA) circuit according to the related art.
Figure 2:
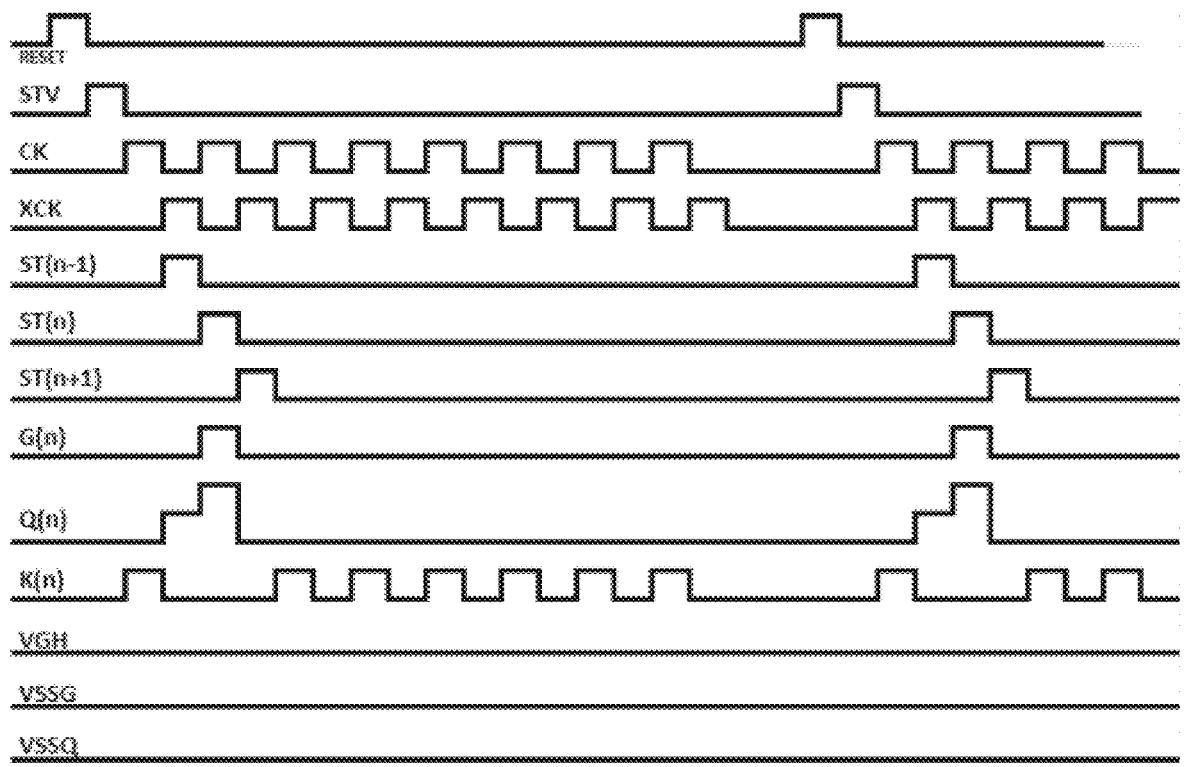
FIG. 2 is a timing diagram of the GOA circuit according to the related art.
Figure 3:
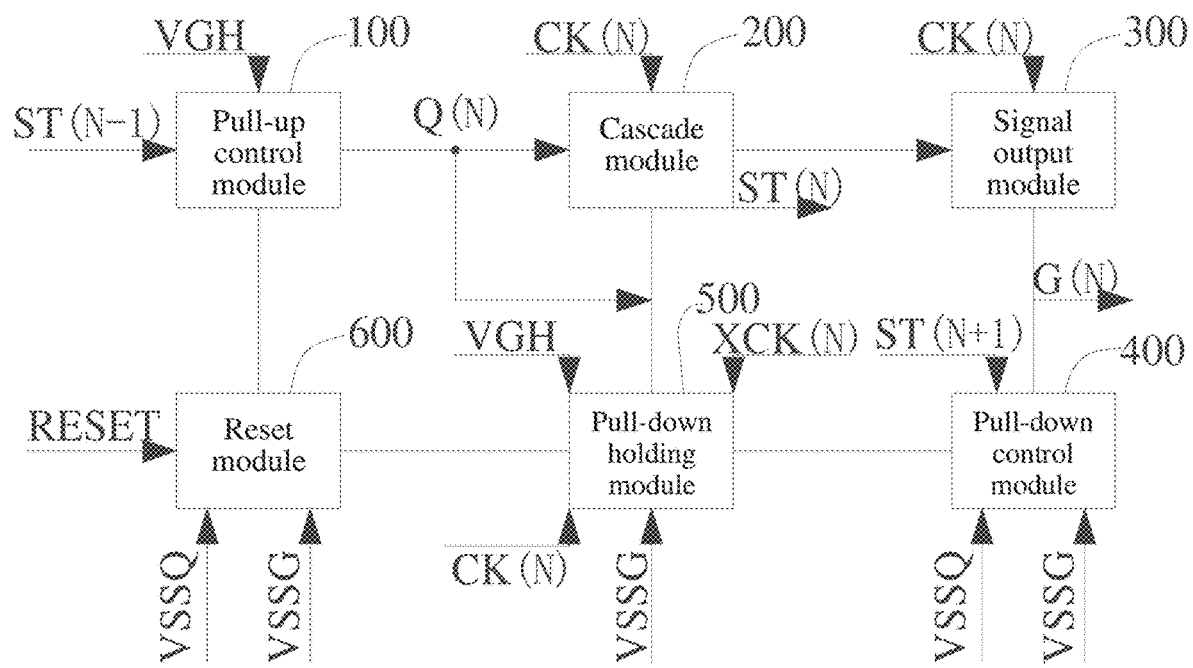
FIG. 3 is a schematic diagram of a first structure of a GOA circuit provided by an embodiment of the present disclosure.

Referring to FIG. 3, FIG. 3 is a schematic diagram of a structure of a GOA circuit provided by an embodiment of the present disclosure. The GOA circuit includes a plurality of GOA units, wherein the GOA units are cascaded. The cascaded GOA units includes an Nth-stage GOA unit including a pull-up control module 100, a cascade module 200, a pull-down holding module 500, a pull-down control module 400, and a signal output module 300. The pull-up control module 100 is configured to control, in response to an (N−1)th-stage stage transfer signal ST(N−1), that a constant high voltage level signal VGH is received by a first driving signal Q(N) output by the pull-up control module 100. The cascade module 200 is configured to control, in response to the first driving signal Q(N) output by the pull-up control module 100, that an Nth-stage first clock signal CK(N) is output as an Nth-stage stage transfer signal ST(N). The pull-down holding module 500 is configured to control, in response to the Nth-stage first clock signal CK(N), an Nth-stage second clock signal XCK(N), and the first driving signal Q(N) output by the pull-up control module 100, that the pull-down holding module 500 electrically couples an Nth-stage gate driving signal G(N) to a second constant low voltage level signal VSSG, electrically couples the Nth-stage stage transfer signal ST(N) to a first constant low voltage level signal VSSQ, and electrically couples the first driving signal Q(N) to the first constant low voltage level signal VSSQ. The pull-down control module 400 is configured to, in response to an (N+1)th-stage stage transfer signal ST(N+1), pull down the first driving signal Q(N) output by the pull-up control module 100 to the first constant low voltage level signal VSSQ and pull down the Nth-stage gate driving signal G(N) to the second constant low voltage level signal VSSG. The signal output module 300 is configured to control, in response to the first driving signal Q(N) output by the pull-up control module 100, that the Nth-stage first clock signal CK(N) is output as the Nth-stage gate driving signal G(N).

Figure 4:
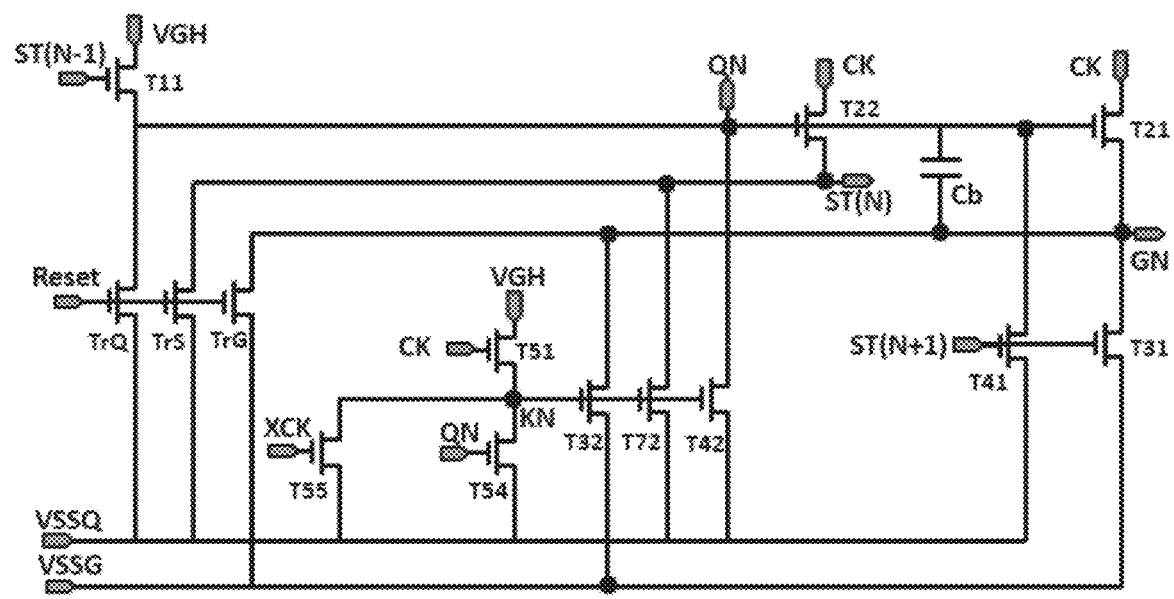
FIG. 4 is a schematic diagram of a second structure of a GOA circuit provided by an embodiment of the present disclosure.

Referring to FIGS. 3 and 4, FIG. 4 is a circuit diagram of the GOA circuit provided by the embodiment of the present disclosure. In an embodiment of the present disclosure, the pull-down holding module 500 includes: an inverter module and a node voltage pull-down holding module. The inverter module includes: a first transistor $T_{51}$, a second transistor $T_{54}$, and a third transistor $T_{55}$; wherein a control terminal of the first transistor $T_{51}$ is electrically coupled to the Nth-stage first clock signal CK(N), a first terminal of the first transistor $T_{51}$ is electrically coupled to the constant high voltage level signal VGH, and a second terminal of the first transistor $T_{51}$ is electrically coupled to a K(N) node; wherein a control terminal of the second transistor $T_{54}$ is electrically coupled to a node where the first driving signal Q(N) is located, a first terminal of the second transistor $T_{54}$ is electrically coupled to the K(N) node, and a second terminal of the second transistor $T_{54}$ is electrically coupled to the first constant low voltage level signal VSSQ; wherein a control terminal of the third transistor $T_{55}$ is electrically coupled to the Nth-stage second clock signal XCK(N), a first terminal of the third transistor $T_{55}$ is electrically coupled to the K(N) node, and a second terminal of the third transistor $T_{55}$ is electrically coupled to the first constant low voltage level signal VSSQ. The node voltage pull-down holding module includes: a fourth transistor $T_{32}$, a fifth transistor $T_{72}$, and a sixth transistor $T_{42}$; wherein control terminals of the fourth transistor $T_{32}$, the fifth transistor $T_{72}$, and the sixth transistor $T_{42}$ are all electrically coupled to the K(N) node, a first terminal of the fourth transistor $T_{32}$ is electrically coupled to the Nth-stage gate driving signal G(N), a second terminal of the fourth transistor $T_{32}$ is electrically coupled to the second constant low voltage level signal VSSG, a first terminal of the fifth transistor $T_{72}$ is electrically coupled to the Nth-stage stage transfer signal ST(N), a first terminal of the sixth transistor $T_{42}$ is electrically coupled to the node where the first driving signal Q(N) is located, second terminals of the fifth transistor $T_{72}$ and the sixth transistor $T_{42}$ are both electrically coupled to the first constant low voltage level signal VSSQ.

In an embodiment of the present disclosure, the pull-up control module 100 is provided with a seventh transistor $T_{11}$ and a bootstrap capacitor $C_b$; wherein a control terminal of the seventh transistor $T_{11}$ is electrically coupled to the (N−1)th-stage stage transfer signal ST(N−1), a first terminal of the seventh transistor $T_{11}$ is electrically coupled to the constant high voltage level signal VGH, and a second terminal of the seventh transistor $T_{11}$ is electrically coupled to the node where the first driving signal Q(N) is located; wherein a first terminal of the bootstrap capacitor $C_b$ is electrically coupled to the node where the first driving signal Q(N) is located, and a second terminal of the bootstrap capacitor $C_b$ is electrically coupled to the Nth-stage gate driving signal G(N).

In the embodiment of the present disclosure, the cascade module 200 includes an eighth transistor $T_{22}$; wherein a control terminal of the eighth transistor $T_{22}$ is electrically coupled to the node where the first driving signal Q(N) is located, a first terminal of the eighth transistor $T_{22}$ is electrically coupled to the Nth-stage first clock signal CK(N), and a second terminal of the eighth transistor $T_{22}$ is electrically coupled to the Nth-stage stage transfer signal ST(N).

In the embodiment of the present disclosure, the pull-down control module 400 includes: a ninth transistor $T_{31}$ and a tenth transistor $T_{41}$; wherein control terminals of the ninth transistor $T_{31}$ and the tenth transistor $T_{41}$ are both electrically coupled to the (N+1)th-stage stage transfer signal ST(N+1), a first terminal of the ninth transistor $T_{31}$ is electrically coupled to the Nth-stage gate driving signal G(N), a second terminal of the ninth transistor $T_{31}$ is electrically coupled to the second constant low voltage level signal VSSG, a first terminal of the tenth transistor $T_{41}$ is electrically coupled to the node where the first driving signal Q(N) is located, and a second terminal of the tenth transistor $T_{41}$ is electrically coupled to the first constant low voltage level signal VSSQ.

In the embodiment of the present disclosure, the signal output module 300 is provided with an eleventh transistor $T_{21}$; wherein a control terminal of the eleventh transistor $T_{21}$ is electrically coupled to the node where the first driving signal Q(N) is located, a first terminal of the eleventh transistor $T_{21}$ is electrically coupled to the Nth-stage first clock signal CK(N), and a second terminal of the eleventh transistor $T_{21}$ is electrically coupled to the Nth-stage gate driving signal G(N).

Referring to FIG. 3, in the embodiment of the present disclosure, the GOA circuit further includes a reset module 600 configured to control, in response to a reset signal RESET, that the first driving signal Q(N) is reset to the first constant low voltage level signal VSSQ, the Nth-stage stage transfer signal ST(N) is reset to the first constant low voltage level signal VSSQ, and the Nth-stage gate driving signal G(N) is reset to the second constant low voltage level signal VSSG.

Referring to FIGS. 3 and 4, in the embodiment of the present disclosure, the reset module 600 includes: a twelfth transistor $T_{rQ}$, a thirteenth transistor $T_{rS}$, and a fourteenth transistor $T_{rG}$; wherein control terminals of the twelfth transistor $T_{rQ}$, the thirteenth transistor $T_{rS}$, and the fourteenth transistor $T_{rG}$ are all electrically coupled to a node where the reset signal RESET is located, a first terminal of the twelfth transistor $T_{rQ}$ is electrically coupled to the node where the first driving signal Q(N) is located, a second terminal of the twelfth transistor $T_{rQ}$ is electrically coupled to the first constant low voltage level signal VSSQ, a first terminal of the thirteenth transistor $T_{rS}$ is electrically coupled to the Nth-stage stage transfer signal ST(N), a second terminal of the thirteenth transistor $T_{rS}$ is electrically coupled to the first constant low voltage level signal VSSQ, a first terminal of the fourteenth transistor $T_{rG}$ is electrically coupled to the Nth-stage gate driving signal G(N), and a second terminal of the fourteenth transistor $T_{rG}$ is electrically coupled to the second constant low voltage level signal VSSG.

Figure 6:
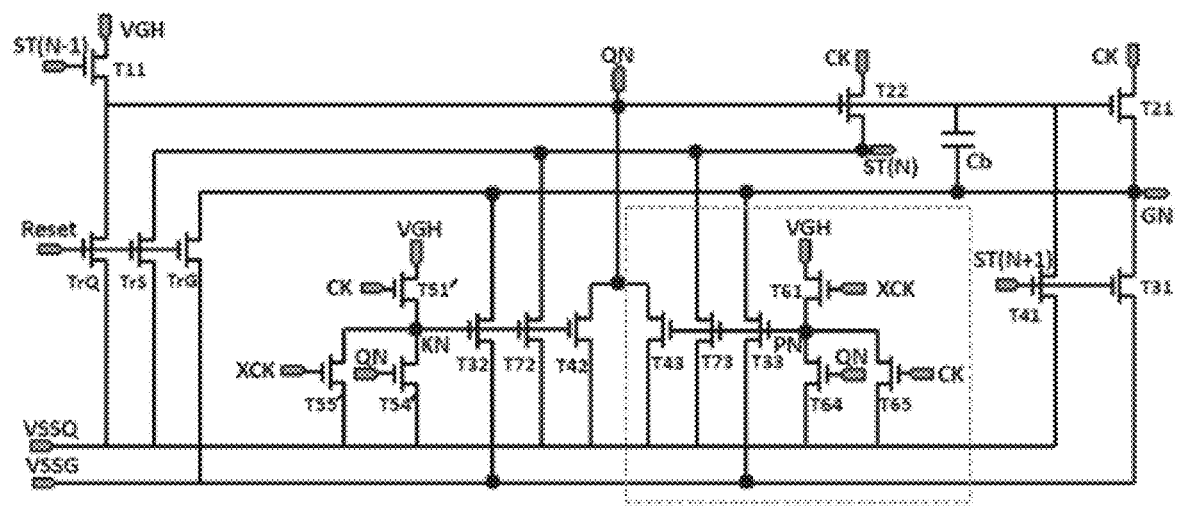
FIG. 6 is a schematic diagram of a third structure of the GOA circuit provided by an embodiment of the present disclosure.

Referring to FIGS. 3 and 6, in an embodiment of the present disclosure, the pull-down holding module 500 includes: a first pull-down holding module and a second pull-down holding module; wherein the first pull-down holding module is provided with a first inverter module and a first node voltage pull-down holding module, and the second pull-down holding module is provided with a second inverter module and a second node voltage pull-down holding module.

Further, the first inverter module includes: a fifteenth transistor $T_{51'}$, a sixteenth transistor $T_{54'}$, and a seventeenth transistor $T_{55'}$; wherein a control terminal of the fifteenth transistor $T_{51'}$ is electrically coupled to the Nth-stage first clock signal CK(N), a first terminal of the fifteenth transistor $T_{51'}$ is electrically coupled to the constant high voltage level signal VGH, and a second terminal of the fifteenth transistor $T_{51'}$ is electrically coupled the K(N) node; wherein a control terminal of the sixteenth transistor $T_{54'}$ is electrically coupled to the node where the first driving signal Q(N) is located, a first terminal of the sixteenth transistor $T_{54'}$ is electrically coupled to the K(N) node, and a second terminal of the sixteenth transistor $T_{54'}$ is electrically coupled to the first constant low voltage level signal VSSQ; wherein a control terminal of the seventeenth transistor $T_{55'}$ is electrically coupled to the Nth-stage second clock signal XCK(N), a first terminal of the seventeenth transistor $T_{55'}$ is electrically coupled to the K(N) node, and a second terminal of the seventeenth transistor $T_{55'}$ is electrically coupled to the first constant low voltage level signal VSSQ; wherein the first node voltage pull-down holding module includes: an eighteenth transistor $T_{32'}$, a nineteenth transistor $T_{72'}$, and a twentieth transistor $T_{42'}$; wherein control terminals of the eighteenth transistor $T_{32'}$, the nineteenth transistor $T_{72'}$, and the twentieth transistor $T_{42'}$ are all electrically coupled to the K(N) node, a first terminal of the eighteenth transistor $T_{32'}$ is electrically coupled to Nth-stage gate driving signal G(N), a second terminal of the eighteenth transistor $T_{32'}$ is electrically coupled to the second constant low voltage level signal VSSG, a first terminal of the nineteenth transistor $T_{72'}$ is electrically coupled to the Nth-stage stage transfer signal ST(N), a second terminal of the nineteenth transistor $T_{72'}$ is electrically coupled to the first constant low voltage level signal VSSQ, a first terminal of the twentieth transistor $T_{42'}$ is electrically coupled to the node where the first driving signal Q(N) is located, and a second terminal of the twentieth transistor $T_{42'}$ is electrically coupled to the first constant low voltage level signal VSSQ; wherein the second inverter module includes: a twenty-first transistor $T_{61}$, a twenty-second transistor $T_{64}$, and a twenty-third transistor $T_{65}$; wherein a control terminal of the twenty-first transistor $T_{61}$ is electrically coupled to the Nth-stage second clock signal XCK(N), a first terminal of the twenty-first transistor $T_{61}$ is electrically coupled to the constant high voltage level signal VGH, and a second terminal of the twenty-first transistor $T_{61}$ is electrically coupled to a P(N) node; wherein a control terminal of the twenty-second transistor $T_{64}$ is electrically coupled to the node where the first driving signal Q(N) is located, a first terminal of the twenty-second transistor $T_{64}$ is electrically coupled to the P(N) node, and a second terminal of the twenty-second transistor $T_{64}$ is electrically coupled to the first constant low voltage level signal VSSQ; wherein a control terminal of the twenty-third transistor $T_{65}$ is electrically coupled to the Nth-stage first clock signal CK(N), a first terminal of the twenty-third transistor $T_{65}$ is electrically coupled to the P(N) node, and a second terminal of twenty-third transistor $T_{65}$ is electrically coupled to the first constant low voltage level signal VSSQ; and wherein the second node voltage pull-down holding module includes: a twenty-fourth transistor $T_{33}$, a twenty-fifth transistor $T_{73}$ and a twenty-sixth transistor $T_{43}$; wherein control terminals of the twenty-fourth transistor $T_{33}$, the twenty-fifth transistor $T_{73}$, and the twenty-sixth transistor $T_{43}$ are all electrically coupled to the P(N) node, a first terminal of the twenty-fourth transistor $T_{33}$ is electrically coupled to the Nth-stage gate driving signal G(N), a second terminal of the twenty-fourth transistor $T_{33}$ is electrically coupled to the second constant low voltage level signal VSSG, a first terminal of the twenty-fifth transistor $T_{73}$ is electrically coupled to the Nth-stage stage transfer signal ST(N), a second terminal of the twenty-fifth transistor $T_{73}$ is electrically coupled to the first constant low voltage level signal VSSQ, a first terminal of the twenty-sixth transistor $T_{43}$ is electrically coupled to the node where the first driving signal Q(N) is located, a second terminal of the twenty-sixth transistor $T_{43}$ is electrically coupled to the first constant low voltage level signal VSSQ; that is, the first node voltage pull-down holding module and the second node voltage pull-down holding module have a same configuration.

Figure 5:
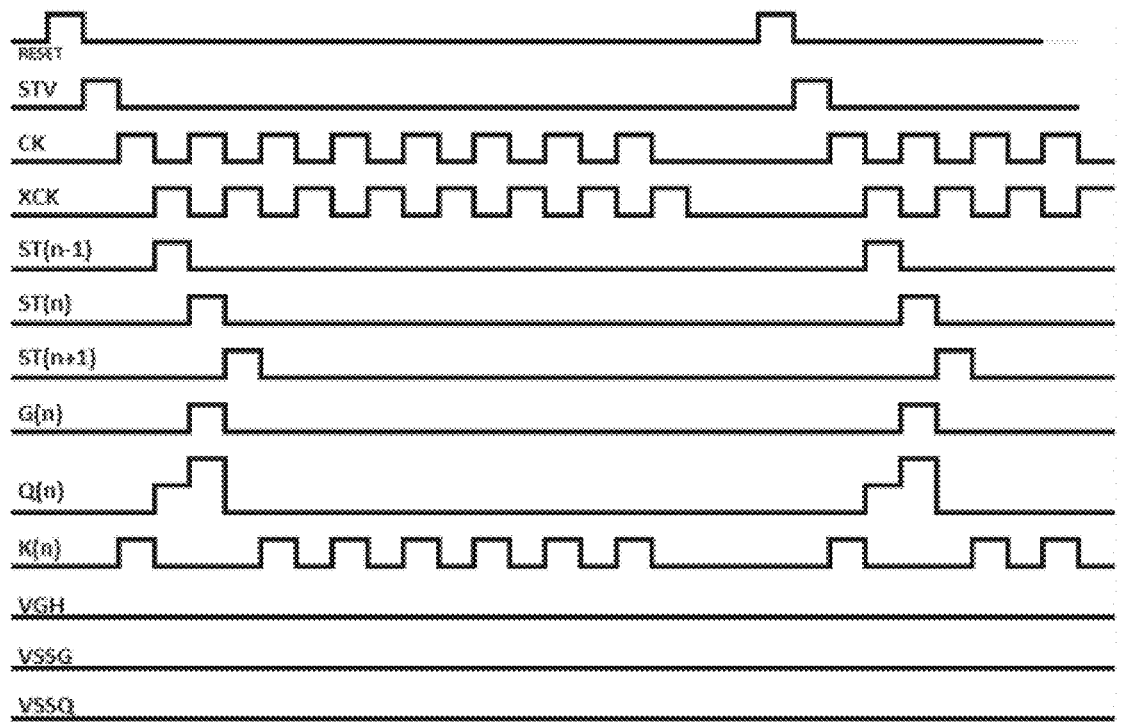
FIG. 5 is a timing diagram of the GOA circuit provided by the embodiment of the present disclosure.

Referring to FIG. 5, FIG. 5 is a timing diagram of the GOA circuit provided by the embodiment of the present disclosure. STV is a start signal, and is turn-on once per frame. The Nth-stage first clock signal CK(N) and the Nth-stage second clock signal XCK(N) are completely opposite high-frequency alternating current (AC) signals. A high electric potential of these signals is denoted as VGH, and a low electric potential of these signals is denoted as VGL. VSSG is a low-voltage direct current (DC) source, and an electric potential of VSSG is −10V. VSSQ is a low-voltage DC source, and an electric potential of VSSQ is VGL. G(N) is an output waveform of the Nth-stage gate driving signal. ST(N) is an output waveform of the Nth-stage stage transfer signal. Q(N) and K(N) are waveforms of Nth-stage important nodes. ST(N−1) is a corresponding waveform of a previous-stage stage transfer signal. ST(N+1) is a corresponding waveform of a next-stage stage transfer signal.

Referring to FIGS. 4 and 5, in response to a high potential pulse of the start signal STV or the stage transfer signal ST(N−1) generated by a previous stage, the node where the first driving signal Q(N) is located is charged to a high electric potential, causing the Nth-stage transistor $T_{21}$ to switch from a turned off state to a turned on state. Then, the Nth-stage first clock signal CK(N) provides a high potential pulse that charges a node where the Nth-stage gate driving signal G(N) is located and a node where the Nth-stage stage transfer signal ST(N) is located to a high electric potential. The high electric potential of the Nth-stage gate driving signal G(N) drives an Nth-stage display area in a display panel. While the Nth-stage stage transfer signal ST(N) is at the high electric potential, for one thing, a ninth transistor $T_{31}$ and a tenth transistor $T_{41}$ in a pull-down control module 400 of the previous stage are turned on, causing a node where a first driving signal Q(N−1) of the previous stage is located and a node where a gate driving signal G(N−1) of the previous stage is located to be pulled down to the first constant low voltage level signal VSSQ and the second constant low voltage level signal VSSG, respectively. For another thing, a transistor $T_{11}$ in a pull-up control module 100 of a next stage is turned on, causing a node where a first driving signal Q(N+1) of the next stage is located to be charged to a high electric potential, thereby realizing a next cascaded stage transfer function. In order to improve reliability of the circuit, the pull-down holding module 500 including the inverter module and the node voltage pull-down holding module is added. The GOA circuit of the present disclosure is different from a traditional GOA circuit in that the inverter module of the GOA circuit of the present disclosure consists of three transistors: the first transistor $T_{51}$, the second transistor $T_{54}$, and the third transistor $T_{55}$. A connection manner of the inverter module is significantly different from a connection manner of the inverter module of the traditional GOA circuit. A gate of the first transistor $T_{51}$ is electrically coupled to the Nth-stage first clock signal CK(N), a drain of the first transistor $T_{51}$ is electrically coupled to the constant high voltage level signal VGH, and a source output of the first transistor $T_{51}$ controls the fourth transistor $T_{32}$, the fifth transistor $T_{72}$, and the sixth transistor $T_{42}$ of the pull-down holding module 500. A connection manner of the second transistor $T_{54}$ is same as that of the traditional inverter module. A gate of the third transistor $T_{55}$ is electrically coupled to the Nth-stage second clock signal XCK(N), a drain of the third transistor $T_{55}$ is electrically coupled to the source of the first transistor $T_{51}$, and a source of the third transistor $T_{55}$ is electrically coupled to the first constant low voltage level signal VSSQ. The third transistor $T_{55}$ cooperates with the first transistor $T_{51}$ on alternately discharging and charging the K(N) node. This type of connection manner of the inverter module can cause bias stress conditions of the first transistor $T_{51}$ and the second transistor $T_{54}$ in the inverter module to be same, and electrical characteristic difference caused by stress to be reduced. Thus, long-term stable operation of the circuit is ensured.

The drain of the first transistor $T_{51}$ is electrically coupled to the constant high voltage level signal VGH and the gate of the first transistor $T_{51}$ is electrically coupled to the Nth-stage first clock signal CK(N). In response to the Nth-stage first clock signal CK(N) that alternates between the high electric potential and the low electric potential, an electrical potential of the source (i.e., the K(N) node) of the first transistor $T_{51}$ changes following the Nth-stage first clock signal CK(N). The first transistor $T_{51}$ is under a strong negative bias stress condition. A gate and a source of the second transistor $T_{54}$ are at low electric potentials for a long time. A drain (i.e., the K(N) node) of the second transistor $T_{54}$ alternates following the high electric potential and the low electric potential of the Nth-stage first clock signal CK(N). The second transistor $T_{54}$ is under a strong negative bias stress condition. The third transistor $T_{55}$ is under a positive bias stress condition for half of the time, and under a negative bias stress condition for the other half of the time. However, because a threshold voltage of the third transistor $T_{55}$ is much smaller than a threshold voltage of the second transistor $T_{54}$, an electrical characteristic of the third transistor $T_{55}$ has less effect on stability of the inverter. The bias stress conditions of the first transistor $T_{51}$ and the second transistor $T_{54}$ are same. After long-term operation, the electrical characteristic difference between the first transistor $T_{51}$ and the second transistor $T_{54}$ is smaller, and the inverter module can still operate stably. Compared with reliability of the inverter module of the traditional GOA circuit, reliability of the inverter module of the present disclosure is significantly increased.

Referring to FIGS. 3 and 6, FIG. 6 is a schematic diagram of a structure of another GOA circuit provided by the present disclosure. In the present embodiment, the pull-down holding module 500 includes: a first pull-down holding module and a second pull-down holding module; wherein the first pull-down holding module is provided with a first inverter module and a first node voltage pull-down holding module, and the second pull-down holding module is provided with a second inverter module and a second node voltage pull-down holding module. The first pull-down holding module is completely same as the pull-down holding module illustrated in FIG. 4. The second pull-down holding module is a newly added pull-down holding module. The second pull-down holding module includes: a second inverter module consisting of the twenty-first transistor $T_{61}$, the twenty-second transistor $T_{64}$, and the twenty-third transistor $T_{65}$, and a second node voltage pull-down holding module consisting of the twenty-fourth transistor $T_{33}$, the twenty-fifth transistor $T_{73}$, and the twenty-sixth transistor $T_{43}$. The newly added second inverter module is different from the original pull-down holding module in that in the newly added second inverter module, a gate of the twenty-first transistor $T_{61}$ is electrically coupled to the Nth-stage second clock signal XCK(N), and a gate of the twenty-third transistor $T_{65}$ is electrically coupled to the Nth-stage first clock signal CK(N). Thus, when the Nth-stage first clock signal CK(N) and the Nth-stage second clock signal XCK(N) are alternately at the high electric potential and the low electric potential, the first inverter module and the second inverter module can alternately operate.

While the node where the first driving signal Q(N) is located is at the high electric potential, both the K(N) node of the first inverter module and the P(N) node of the second inverter module are at low electric potentials. The eighteenth transistor $T_{32'}$, the nineteenth transistor $T_{72'}$, and the twentieth transistor $T_{42'}$, and the twenty-fourth transistor $T_{33}$, twenty-fifth transistor $T_{73}$, and the twenty-sixth transistor $T_{43}$ are all in a turned off state and do not affect the high electric potentials of the Nth-stage gate driving signal G(N), the Nth-stage stage transfer signal ST(N), and the first driving signal Q(N).

During a period while the low electric potentials of the Nth-stage gate driving signal G(N), the Nth-stage stage transfer signal ST(N), and the first driving signal Q(N) need to be held, the Nth-stage first clock signal CK(N) and the Nth-stage second clock signal XCK(N) are alternately at the high electric potential and the low electric potential. While the Nth-stage first clock signal CK(N) is at the high electric potential, and the Nth-stage second clock signal XCK(N) is at the low electric potential, the K(N) node is at a high electric potential and the P(N) node is at the low electric potential. During this time, the eighteenth transistor $T_{32'}$, the nineteenth transistor $T_{72'}$, and the twentieth transistor $T_{42'}$ are turned on, causing the low electric potentials to be held at the node where the Nth-stage gate driving signal G(N) is located, the node where the Nth-stage stage transfer signal ST(N) is located, and the node where the first driving signal Q(N) is located. When the Nth-stage first clock signal CK(N) is switched to the low electric potential, and the Nth-stage second clock signal XCK(N) is switched to the high electric potential, the twenty-fourth transistor $T_{33}$, the twenty-fifth transistor $T_{73}$, and the twenty-sixth transistor $T_{43}$ are turned on, also causing the low electric potentials to be held at the node where the Nth-stage gate driving signal G(N) is located, the node where the Nth-stage stage transfer signal ST(N) is located, and the node where the first driving signal Q(N) is located. Thus, during an entire pull-down holding period, the low electric potentials are held at the node where the Nth-stage gate driving signal G(N) is located, the node where the Nth-stage stage transfer signal ST(N) is located, and the node where the first driving signal Q(N) is located. Compared with the original circuit that has only one pull-down holding module, the circuit here has two pull-down holding modules that alternately operate. A holding period is longer and circuit stability is better.

The Nth-stage first clock signal CK(N) and the Nth-stage second clock signal XCK(N) used by the inverter module are completely opposite high-frequency AC signals and the Nth-stage first clock signal CK(N) is shared with the cascade module and the signal output module which the Nth-stage first clock signal CK(N) is electrically coupled to. In another case, the inverter module can also not share the Nth-stage first clock signal CK(N) with the cascade module and the signal output module in which the Nth-stage first clock signal CK(N) is located. A set of the Nth-stage first clock signal CK(N) and the Nth-stage second clock signal XCK(N) is replaced by an additional set of AC signals with opposite phases. A frequency of the signals for replacement is variable. For example, the frequency of the signals is switching once within display time of one frame or is switching once within display time of multiple frames.

The aforementioned transistors can be N-type transistors or a combination of N-type transistors and P-type transistors. When the transistors are used as switching transistors, the functions of each source and a corresponding drain can be interchanged, and no specific distinction is made here.

Thus, the GOA circuit provided by the present disclosure has the following advantageous effects. In the GOA circuit provided by the present disclosure, the inverter module in the pull-down holding module is optimized under the basis of maintenance of functions of a traditional technical solution. Thus, difference in a voltage-ampere characteristic between each of the transistors after long-term operation of the inverter module is effectively reduced, thereby increasing operating time of the inverter module.

Some embodiments of the GOA circuit according to the present disclosure have been described in detail above. The principles and implementation manners of the present disclosure are described using specific examples. The description of the foregoing embodiments is only for facilitating understanding of the technical solutions of the present disclosure and the core ideas thereof. Persons of ordinary skill in the art should understand that the technical solution described in each of the foregoing embodiments can be modified, or at least one technical feature described in each of the foregoing embodiments can be replaced by at least one equivalent alternative. The modification or the at least one alternative should not cause the essence of the corresponding technical solution to depart from the scope of the technical solution of each embodiment of the present disclosure.

What is claimed is:

1. A gate driver on array (GOA) circuit, comprising: a plurality of GOA units, wherein the GOA units are cascaded; and wherein the cascaded GOA units comprise an Nth-stage GOA unit comprising:
a pull-up control module configured to control, in response to an (N−1)th-stage stage transfer signal, that a constant high voltage level signal is received by a first driving signal output by the pull-up control module;
a cascade module configured to control, in response to the first driving signal output by the pull-up control module, that an Nth-stage first clock signal is output as an Nth-stage stage transfer signal;
a pull-down holding module configured to control, in response to the Nth-stage first clock signal, an Nth-stage second clock signal, and the first driving signal output by the pull-up control module, that the pull-down holding module electrically couples an Nth-stage gate driving signal to a second constant low voltage level signal, electrically couples the Nth-stage stage transfer signal to a first constant low voltage level signal, and electrically couples the first driving signal to the first constant low voltage level signal;
the pull-down control module configured to, in response to an (N+1)th-stage stage transfer signal, pull down the first driving signal output by the pull-up control module to the first constant low voltage level signal and pull down the Nth-stage gate driving signal to the second constant low voltage level signal; and
the signal output module configured to control, in response to the first driving signal output by the pull-up control module, that the Nth-stage first clock signal is output as the Nth-stage gate driving signal;
wherein the Nth-stage first clock signal and the Nth-stage second clock signal are completely opposite high-frequency alternating current (AC) signals.

2. The GOA circuit of claim 1, wherein the pull-down holding module comprises: an inverter module and a node voltage pull-down holding module; wherein the inverter module comprises: a first transistor ($T_{51}$), a second transistor ($T_{54}$), and a third transistor ($T_{55}$); wherein a control terminal of the first transistor ($T_{51}$) is electrically coupled to the Nth-stage first clock signal, a first terminal of the first transistor ($T_{51}$) is electrically coupled to the constant high voltage level signal, and a second terminal of the first transistor ($T_{51}$) is electrically coupled to a K(N) node; wherein a control terminal of the second transistor ($T_{54}$) is electrically coupled to a node where the first driving signal is located, a first terminal of the second transistor ($T_{54}$) is electrically coupled to the K(N) node, and a second terminal of the second transistor ($T_{54}$) is electrically coupled to the first constant low voltage level signal; wherein a control terminal of the third transistor ($T_{55}$) is electrically coupled to the Nth-stage second clock signal, a first terminal of the third transistor ($T_{55}$) is electrically coupled to the K(N) node, and a second terminal of the third transistor ($T_{55}$) is electrically coupled to the first constant low voltage level signal; wherein the node voltage pull-down holding module comprises: a fourth transistor ($T_{32}$), a fifth transistor ($T_{72}$), and a sixth transistor ($T_{42}$); wherein control terminals of the fourth transistor ($T_{32}$), the fifth transistor ($T_{72}$), and the sixth transistor ($T_{42}$) are all electrically coupled to the K(N) node, a first terminal of the fourth transistor ($T_{32}$) is electrically coupled to the Nth-stage gate driving signal, a second terminal of the fourth transistor ($T_{32}$) is electrically coupled to the second constant low voltage level signal, a first terminal of the fifth transistor ($T_{72}$) is electrically coupled to the Nth-stage stage transfer signal, a first terminal of the sixth transistor ($T_{42}$) is electrically coupled to the node where the first driving signal is located, second terminals of the fifth transistor ($T_{72}$) and the sixth transistor ($T_{42}$) are both electrically coupled to the first constant low voltage level signal.

3. The GOA circuit of claim 1, wherein the pull-up control module is provided with a seventh transistor ($T_{11}$) and a bootstrap capacitor ($C_b$); wherein a control terminal of the seventh transistor ($T_{11}$) is electrically coupled to the (N−1)th-stage stage transfer signal, a first terminal of the seventh transistor ($T_{11}$) is electrically coupled to the constant high voltage level signal, and a second terminal of the seventh transistor ($T_{11}$) is electrically coupled to a node where the first driving signal is located; wherein a first terminal of the bootstrap capacitor ($C_b$) is electrically coupled to the node where the first driving signal is located, and a second terminal of the bootstrap capacitor ($C_b$) is electrically coupled to the Nth-stage gate driving signal.

4. The GOA circuit of claim 1, wherein the cascade module comprises an eighth transistor ($T_{22}$); wherein a control terminal of the eighth transistor ($T_{22}$) is electrically coupled to a node where the first driving signal is located, a first terminal of the eighth transistor ($T_{22}$) is electrically coupled to the Nth-stage first clock signal, and a second terminal of the eighth transistor ($T_{22}$) is electrically coupled to the Nth-stage stage transfer signal.

5. The GOA circuit of claim 1, wherein the pull-down control module comprises: a ninth transistor ($T_{31}$) and a tenth transistor ($T_{41}$); wherein control terminals of the ninth transistor ($T_{31}$) and the tenth transistor ($T_{41}$) are both electrically coupled to the (N+1)th-stage stage transfer signal, a first terminal of the ninth transistor ($T_{31}$) is electrically coupled to the Nth-stage gate driving signal, a second terminal of the ninth transistor ($T_{31}$) is electrically coupled to the second constant low voltage level signal, a first terminal of the tenth transistor ($T_{41}$) is electrically coupled to a node where the first driving signal is located, and a second terminal of the tenth transistor ($T_{41}$) is electrically coupled to the first constant low voltage level signal.

6. The GOA circuit of claim 1, wherein the signal output module is provided with an eleventh transistor ($T_{21}$); wherein a control terminal of the eleventh transistor ($T_{21}$) is electrically coupled to a node where the first driving signal is located, a first terminal of the eleventh transistor ($T_{21}$) is electrically coupled to the Nth-stage first clock signal, and a second terminal of the eleventh transistor ($T_{21}$) is electrically coupled to the Nth-stage gate driving signal.

7. The GOA circuit of claim 1, wherein the GOA circuit further comprises a reset module configured to control, in response to a reset signal, that the first driving signal is reset to the first constant low voltage level signal, the Nth-stage stage transfer signal is reset to the first constant low voltage level signal, and the Nth-stage gate driving signal is reset to the second constant low voltage level signal.

8. The GOA circuit of claim 7, wherein the reset module comprises: a twelfth transistor ($T_{rQ}$), a thirteenth transistor ($T_{rS}$), and a fourteenth transistor ($T_{rG}$); wherein control terminals of the twelfth transistor ($T_{rQ}$), the thirteenth transistor ($T_{rS}$), and the fourteenth transistor ($T_{rG}$) are all electrically coupled to a node where the reset signal is located, a first terminal of the twelfth transistor ($T_{rQ}$) is electrically coupled to a node where the first driving signal is located, a second terminal of the twelfth transistor ($T_{rQ}$) is electrically coupled to the first constant low voltage level signal, a first terminal of the thirteenth transistor ($T_{rS}$) is electrically coupled to the Nth-stage stage transfer signal, a second terminal of the thirteenth transistor ($T_{rS}$) is electrically coupled to the first constant low voltage level signal, a first terminal of the fourteenth transistor ($T_{rG}$) is electrically coupled to the Nth-stage gate driving signal, and a second terminal of the fourteenth transistor ($T_{rG}$) is electrically coupled to the second constant low voltage level signal.

9. The GOA circuit of claim 1, wherein the pull-down holding module comprises: a first pull-down holding module and a second pull-down holding module; wherein the first pull-down holding module is provided with a first inverter module and a first node voltage pull-down holding module, and the second pull-down holding module is provided with a second inverter module and a second node voltage pull-down holding module.

10. The GOA circuit of claim 9, wherein the first inverter module comprises: a fifteenth transistor ($T_{51'}$), a sixteenth transistor ($T_{54'}$), and a seventeenth transistor ($T_{55'}$); wherein a control terminal of the fifteenth transistor ($T_{51'}$) is electrically coupled to the Nth-stage first clock signal, a first terminal of the fifteenth transistor ($T_{51'}$) is electrically coupled to the constant high voltage level signal, and a second terminal of the fifteenth transistor ($T_{51'}$) is electrically coupled a K(N) node; wherein a control terminal of the sixteenth transistor ($T_{54'}$) is electrically coupled to a node where the first driving signal is located, a first terminal of the sixteenth transistor ($T_{54'}$) is electrically coupled to the K(N) node, and a second terminal of the sixteenth transistor ($T_{54'}$) is electrically coupled to the first constant low voltage level signal; wherein a control terminal of the seventeenth transistor ($T_{55'}$) is electrically coupled to the Nth-stage second clock signal, a first terminal of the seventeenth transistor ($T_{55'}$) is electrically coupled to the K(N) node, and a second terminal of the seventeenth transistor ($T_{55'}$) is electrically coupled to the first constant low voltage level signal; wherein the first node voltage pull-down holding module comprises: an eighteenth transistor ($T_{32'}$), a nineteenth transistor ($T_{72'}$), and a twentieth transistor ($T_{42'}$); wherein control terminals of the eighteenth transistor ($T_{32'}$), the nineteenth transistor ($T_{72'}$), and the twentieth transistor ($T_{42'}$) are all electrically coupled to the K(N) node, a first terminal of the eighteenth transistor ($T_{32'}$) is electrically coupled to Nth-stage gate driving signal, a second terminal of the eighteenth transistor ($T_{32'}$) is electrically coupled to the second constant low voltage level signal, a first terminal of the nineteenth transistor ($T_{72'}$) is electrically coupled to the Nth-stage stage transfer signal, a second terminal of the nineteenth transistor ($T_{72'}$) is electrically coupled to the first constant low voltage level signal, a first terminal of the twentieth transistor ($T_{42'}$) is electrically coupled to the node where the first driving signal is located, and a second terminal of the twentieth transistor ($T_{42'}$) is electrically coupled to the first constant low voltage level signal; wherein the second inverter module comprises: a twenty-first transistor ($T_{61}$), a twenty-second transistor ($T_{64}$), and a twenty-third transistor ($T_{65}$); wherein a control terminal of the twenty-first transistor ($T_{61}$) is electrically coupled to the Nth-stage second clock signal, a first terminal of the twenty-first transistor ($T_{61}$) is electrically coupled to the constant high voltage level signal, and a second terminal of the twenty-first transistor ($T_{61}$) is electrically coupled to a P(N) node; wherein a control terminal of the twenty-second transistor ($T_{64}$) is electrically coupled to the node where the first driving signal is located, a first terminal of the twenty-second transistor ($T_{64}$) is electrically coupled to the P(N) node, and a second terminal of the twenty-second transistor ($T_{64}$) is electrically coupled to the first constant low voltage level signal; wherein a control terminal of the twenty-third transistor ($T_{65}$) is electrically coupled to the Nth-stage first clock signal, a first terminal of the twenty-third transistor ($T_{65}$) is electrically coupled to the P(N) node, and a second terminal of twenty-third transistor ($T_{65}$) is electrically coupled to the first constant low voltage level signal; and wherein the second node voltage pull-down holding module comprises: a twenty-fourth transistor ($T_{33}$), a twenty-fifth transistor ($T_{73}$) and a twenty-sixth transistor ($T_{43}$); wherein control terminals of the twenty-fourth transistor ($T_{33}$), the twenty-fifth transistor ($T_{73}$), and the twenty-sixth transistor ($T_{43}$) are all electrically coupled to the P(N) node, a first terminal of the twenty-fourth transistor ($T_{33}$) is electrically coupled to the Nth-stage gate driving signal, a second terminal of the twenty-fourth transistor ($T_{33}$) is electrically coupled to the second constant low voltage level signal, a first terminal of the twenty-fifth transistor ($T_{73}$) is electrically coupled to the Nth-stage stage transfer signal, a second terminal of the twenty-fifth transistor ($T_{73}$) is electrically coupled to the first constant low voltage level signal, a first terminal of the twenty-sixth transistor ($T_{43}$) is electrically coupled to the node where the first driving signal is located, a second terminal of the twenty-sixth transistor ($T_{43}$) is electrically coupled to the first constant low voltage level signal.

11. The GOA circuit of claim 9, wherein the transistors are N-type transistors or the transistors are a combination of N-type transistors and P-type transistors.

12. A gate driver on array (GOA) circuit, comprising: a plurality of GOA units, wherein the GOA units are cascaded; and wherein the cascaded GOA units comprise an Nth-stage GOA unit comprising:
a pull-up control module configured to control, in response to an (N−1)th-stage stage transfer signal, that a constant high voltage level signal is received by a first driving signal output by the pull-up control module;
a cascade module configured to control, in response to the first driving signal output by the pull-up control module, that an Nth-stage first clock signal is output as an Nth-stage stage transfer signal;
a pull-down holding module configured to control, in response to the Nth-stage first clock signal, an Nth-stage second clock signal, and the first driving signal output by the pull-up control module, that the pull-down holding module electrically couples an Nth-stage gate driving signal to a second constant low voltage level signal, electrically couples the Nth-stage stage transfer signal to a first constant low voltage level signal, and electrically couples the first driving signal to the first constant low voltage level signal;
the pull-down control module configured to, in response to an (N+1)th-stage stage transfer signal, pull down the first driving signal output by the pull-up control module to the first constant low voltage level signal and pull down the Nth-stage gate driving signal to the second constant low voltage level signal; and
the signal output module configured to control, in response to the first driving signal output by the pull-up control module, that the Nth-stage first clock signal is output as the Nth-stage gate driving signal.

13. The GOA circuit of claim 12, wherein the pull-down holding module comprises: an inverter module and a node voltage pull-down holding module; wherein the inverter module comprises: a first transistor ($T_{51}$), a second transistor ($T_{54}$), and a third transistor ($T_{55}$); wherein a control terminal of the first transistor ($T_{51}$) is electrically coupled to the Nth-stage first clock signal, a first terminal of the first transistor ($T_{51}$) is electrically coupled to the constant high voltage level signal, and a second terminal of the first transistor ($T_{51}$) is electrically coupled to a K(N) node; wherein a control terminal of the second transistor ($T_{54}$) is electrically coupled to a node where the first driving signal is located, a first terminal of the second transistor ($T_{54}$) is electrically coupled to the K(N) node, and a second terminal of the second transistor ($T_{54}$) is electrically coupled to the first constant low voltage level signal; wherein a control terminal of the third transistor ($T_{55}$) is electrically coupled to the Nth-stage second clock signal, a first terminal of the third transistor ($T_{55}$) is electrically coupled to the K(N) node, and a second terminal of the third transistor ($T_{55}$) is electrically coupled to the first constant low voltage level signal; wherein the node voltage pull-down holding module comprises: a fourth transistor ($T_{32}$), a fifth transistor ($T_{72}$), and a sixth transistor ($T_{42}$); wherein control terminals of the fourth transistor ($T_{32}$), the fifth transistor ($T_{72}$), and the sixth transistor ($T_{42}$) are all electrically coupled to the K(N) node, a first terminal of the fourth transistor ($T_{32}$) is electrically coupled to the Nth-stage gate driving signal, a second terminal of the fourth transistor ($T_{32}$) is electrically coupled to the second constant low voltage level signal, a first terminal of the fifth transistor ($T_{72}$) is electrically coupled to the Nth-stage stage transfer signal, a first terminal of the sixth transistor ($T_{42}$) is electrically coupled to the node where the first driving signal is located, second terminals of the fifth transistor ($T_{72}$) and the sixth transistor ($T_{42}$) are both electrically coupled to the first constant low voltage level signal.

14. The GOA circuit of claim 12, wherein the pull-up control module is provided with a seventh transistor ($T_{11}$) and a bootstrap capacitor ($C_b$); wherein a control terminal of the seventh transistor ($T_{11}$) is electrically coupled to the (N−1)th-stage stage transfer signal, a first terminal of the seventh transistor ($T_{11}$) is electrically coupled to the constant high voltage level signal, and a second terminal of the seventh transistor ($T_{11}$) is electrically coupled to a node where the first driving signal is located; wherein a first terminal of the bootstrap capacitor ($C_b$) is electrically coupled to the node where the first driving signal is located, and a second terminal of the bootstrap capacitor ($C_b$) is electrically coupled to the Nth-stage gate driving signal.

15. The GOA circuit of claim 12, wherein the cascade module comprises an eighth transistor ($T_{22}$); wherein a control terminal of the eighth transistor ($T_{22}$) is electrically coupled to a node where the first driving signal is located, a first terminal of the eighth transistor ($T_{22}$) is electrically coupled to the Nth-stage first clock signal, and a second terminal of the eighth transistor ($T_{22}$) is electrically coupled to the Nth-stage stage transfer signal.

16. The GOA circuit of claim 12, wherein the pull-down control module comprises: a ninth transistor ($T_{31}$) and a tenth transistor ($T_{41}$); wherein control terminals of the ninth transistor ($T_{31}$) and the tenth transistor ($T_{41}$) are both electrically coupled to the (N+1)th-stage stage transfer signal, a first terminal of the ninth transistor ($T_{31}$) is electrically coupled to the Nth-stage gate driving signal, a second terminal of the ninth transistor ($T_{31}$) is electrically coupled to the second constant low voltage level signal, a first terminal of the tenth transistor ($T_{41}$) is electrically coupled to a node where the first driving signal is located, and a second terminal of the tenth transistor ($T_{41}$) is electrically coupled to the first constant low voltage level signal.

17. The GOA circuit of claim 12, wherein the signal output module is provided with an eleventh transistor ($T_{21}$); wherein a control terminal of the eleventh transistor ($T_{21}$) is electrically coupled to a node where the first driving signal is located, a first terminal of the eleventh transistor ($T_{21}$) is electrically coupled to the Nth-stage first clock signal, and a second terminal of the eleventh transistor ($T_{21}$) is electrically coupled to the Nth-stage gate driving signal.

18. The GOA circuit of claim 12, wherein the GOA circuit further comprises a reset module configured to control, in response to a reset signal, that the first driving signal is reset to the first constant low voltage level signal, the Nth-stage stage transfer signal is reset to the first constant low voltage level signal, and the Nth-stage gate driving signal is reset to the second constant low voltage level signal.

19. The GOA circuit of claim 18, wherein the reset module comprises: a twelfth transistor ($T_{rQ}$), a thirteenth transistor ($T_{rS}$), and a fourteenth transistor ($T_{rG}$); wherein control terminals of the twelfth transistor ($T_{rQ}$), the thirteenth transistor ($T_{rS}$), and the fourteenth transistor ($T_{rG}$) are all electrically coupled to a node where the reset signal is located, a first terminal of the twelfth transistor ($T_{rQ}$) is electrically coupled to a node where the first driving signal is located, a second terminal of the twelfth transistor ($T_{rQ}$) is electrically coupled to the first constant low voltage level signal, a first terminal of the thirteenth transistor ($T_{rS}$) is electrically coupled to the Nth-stage stage transfer signal, a second terminal of the thirteenth transistor ($T_{rS}$) is electrically coupled to the first constant low voltage level signal, a first terminal of the fourteenth transistor ($T_{rG}$) is electrically coupled to the Nth-stage gate driving signal, and a second terminal of the fourteenth transistor ($T_{rG}$) is electrically coupled to the second constant low voltage level signal.

20. The GOA circuit of claim 12, wherein the pull-down holding module comprises: a first pull-down holding module and a second pull-down holding module; wherein the first pull-down holding module is provided with a first inverter module and a first node voltage pull-down holding module, and the second pull-down holding module is provided with a second inverter module and a second node voltage pull-down holding module.

* * * * *